(12) United States Patent
Oshinowo

(10) Patent No.: US 6,352,084 B1
(45) Date of Patent: Mar. 5, 2002

(54) SUBSTRATE TREATMENT DEVICE

(75) Inventor: John Oshinowo, Bad Dürrheim (DE)

(73) Assignee: Steag MicroTech GmbH (DE)

( * ) Notice: Subject to any disclaimer, the term of this patent is extended or adjusted under 35 U.S.C. 154(b) by 0 days.

(21) Appl. No.: 09/297,219

(22) PCT Filed: Oct. 1, 1997

(86) PCT No.: PCT/EP97/05407

§ 371 Date: Apr. 23, 1999

§ 102(e) Date: Apr. 23, 1999

(87) PCT Pub. No.: WO98/18155

PCT Pub. Date: Apr. 30, 1998

(30) Foreign Application Priority Data

Oct. 24, 1996 (DE) .......................... 196 44 253

(51) Int. Cl.⁷ .................................. B08B 3/04
(52) U.S. Cl. .................... 134/182; 134/186; 134/902
(58) Field of Search .................. 134/186, 902, 134/198, 109, 182, 183; 239/565, 550, 553.5

(56) References Cited

U.S. PATENT DOCUMENTS

| | | | |
|---|---|---|---|
| 3,777,987 A | * 12/1973 | Allport | |
| 4,092,176 A | * 5/1978 | Kozai et al. | |
| 4,599,966 A | * 7/1986 | Lyman | 134/902 |
| 4,704,658 A | * 11/1987 | Yokouchi et al. | |
| 4,753,258 A | * 6/1988 | Seiichiro | 134/902 |
| 4,919,336 A | * 4/1990 | Hudon et al. | |
| 5,014,727 A | 5/1991 | Aigo | |
| 5,071,488 A | 12/1991 | Takayama et al. | |
| 5,370,142 A | 12/1994 | Nishi et al. | |
| 5,474,616 A | 12/1995 | Hayami et al. | |
| 5,482,068 A | * 1/1996 | Kitahara et al. | 134/902 |
| 5,531,236 A | * 7/1996 | Kempka et al. | 134/902 |
| 5,620,144 A | * 4/1997 | Strock et al. | |

FOREIGN PATENT DOCUMENTS

| | | | |
|---|---|---|---|
| DE | 44 13 077 | 10/1995 | |
| DE | 195 46 990 | 7/1996 | |
| DE | 195 37 897 | 4/1997 | |
| DE | 196 16 402 | 11/1997 | |
| DE | 196 37 875 | 11/1997 | |
| JP | 64-42134 | * 2/1989 | 134/902 |
| JP | 1-184926 | * 7/1989 | 134/902 |
| JP | 3-250732 | * 11/1991 | 134/902 |
| JP | 3266431 | 11/1991 | |
| JP | 4-58529 | * 2/1992 | 134/902 |
| JP | 4-207030 | * 7/1992 | 134/902 |
| JP | 5-62956 | * 3/1993 | 134/902 |
| JP | 5136116 | 6/1993 | |
| JP | 5-136116 | * 6/1993 | 134/902 |
| JP | 5234978 | 9/1993 | |
| JP | 5259143 | 10/1993 | |
| JP | 6-196466 | * 7/1994 | 134/902 |
| JP | 6196466 | 7/1994 | |
| JP | 4267981 | 12/1994 | |
| JP | 07106295 | 4/1995 | |
| JP | 07249604 | 9/1995 | |

* cited by examiner

Primary Examiner—Frankie L. Stinson
(74) Attorney, Agent, or Firm—R.W. Becker & Associates; R. W. Becker

(57) ABSTRACT

A device for the treatment of substrates (2) has a container having a bottom and being filled with a treatment fluid. The treatment fluid streams in from below through the bottom of the container. At least two inlet tubes are provided for the treatment fluid underneath the container bottom. Each of the at least two inlet tubes is provided with projecting comb-like distribution channels. The at least two inlet tubes and the distribution channels are arranged in a common plane. The distribution channels of one of the at least two inlet tubes are respectively positioned between two of the distribution channels of the other one of the two inlet tubes.

21 Claims, 5 Drawing Sheets

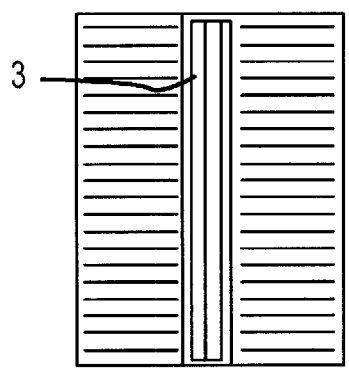
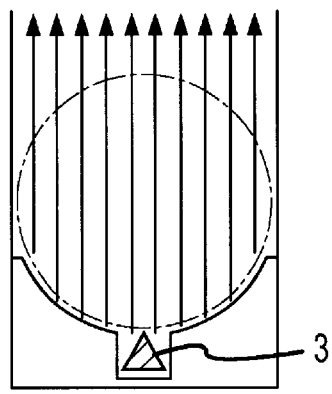
FIG.5a  FIG.5b
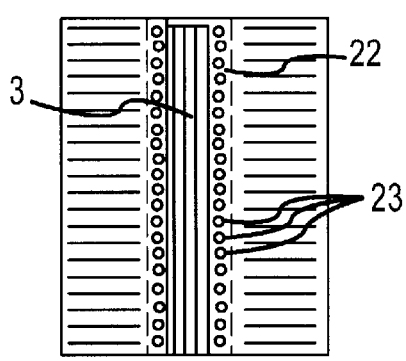
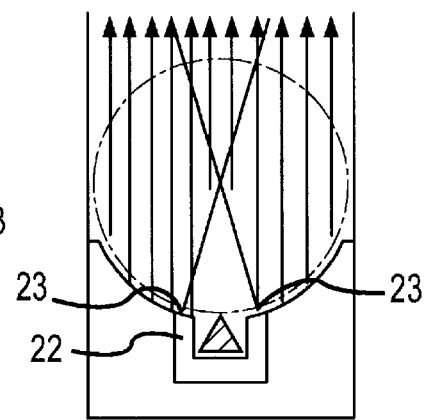
FIG.6a  FIG.6b
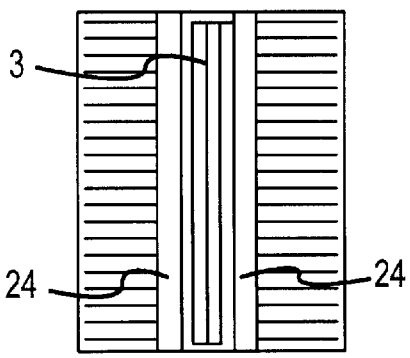
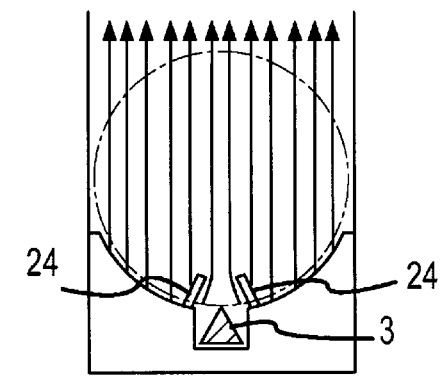
FIG.7a  FIG.7b

SUBSTRATE TREATMENT DEVICE

BACKGROUND OF THE INVENTION

The invention concerns a device for the treatment of substrates comprising a container filled with a treatment fluid, wherein the treatment fluid streams in from below through the container bottom.

Devices of the aforementioned kind have been known, for instance, from DE 44 13 077 A1 and DE 195 46 990 A1 of the applicant of this present patent application and are also described in the German patent applications DE 195 37 879.2, DE 196 16 402.8, DE 196 15 969.5 or DE 196 37 875.3 of the same applicant, which have not been published as of the filing date of this application. Devices of the aforementioned kind have been successfully used in practice. However, they require a relatively high volume of costly, environmentally harmful and difficult-to-recycle treatment fluid. Furthermore, the requirement exists to provide flow conditions of the treatment fluid in the treatment container as steady as possible in order to treat the substrates to be processed, in particular during rinsing, homogeneously and uniformly across the entire substrate areas.

From the documents JP 3-266 431 A2 and JP 5-136 116 A2 devices of the aforementioned kind are known in which the container bottom is circular arc-shaped and matches the shape of circular discs. The device known from JP 7 249 604 A2 has a container bottom matching the shape of a cassette, wherein the cassette during fluid treatment is arranged in the cassette. The fluid in this known device is not introduced from below through the container bottom. The container bottom only has outlet openings through which the fluid content in the container is drained. From U.S. Pat. No. 5 071 488 and JP 6-252 120 A2 devices with a fluid inlet from below are known in which the wafers during treatment are arranged in a cassette and the fluid flows out via an outlet at the upper end of the fluid container. From JP 4-267 981 A2 a device of the aforementioned kind is known which comprises a venting tube that is in communication with an inlet area below the actual fluid container and serves to remove air bubbles that may be present within the supplied hot clean water.

From U.S. Pat. No. 5 014 727, JP 7-106 295 A2 and JP 5-259 143 A2 devices of the aforementioned kind are known in which the fluid to be introduced is distributed below the container bottom into different distribution channels or tubes. JP 6-195 466 A2 shows a cleaning tank in which the cleaning liquid is introduced into the cleaning tank from below through slots arranged in the direction of the wafer edges. In the substrate treatment device known from JP 5-232 978 A2 the container bottom is comprised of a plurality of stacked plates having openings embodied such that the treatment fluid introduced from below is distributed to a plurality of outlet openings.

Based on this, the object of the invention is the development of a device of the aforementioned kind that provides an optimized treatment uniformly across the entire substrate areas with a minimum of design and manufacturing expenditures and with the minimum volume of treatment fluid possible.

SUMMARY OF THE INVENTION

The object of the invention is solved by providing at least two inlet tubes for the treatment fluid under the container bottom, wherein each is comprised of projecting comb-like meshing distribution channels. Such a fluid distribution system under the container bottom allows a steady inlet flow of the fluid and, thus, a homogeneous treatment of the substrates through the fluid regardless of the substrate area, i.e., regardless of the positioning of the substrate areas in the vicinity of the container walls or not. The comb-like distribution channels of at least one inlet tube are advantageously projecting perpendicularly therefrom and are advantageously positioned at the same level, wherein it is especially advantageous to position one distribution channel of an inlet tube respectively between two distribution channels of the other inlet tube. In this manner, the distribution channels of one level are alternatingly supplied with treatment fluid from different sides via the inlet tubes, resulting in a balanced discharged fluid volume and pressure across the entire area, providing a generally steady fluid introduction into the fluid container across the entire container area.

According to an advantageous embodiment of the invention, not only the distribution tubes are provided with outlet openings, but also the inlet tubes from which the distribution channels are projecting, thus providing a diffusor system with steady outlet flow conditions for the treatment fluid across the entire bottom area of the container. The inlet and/or distribution tubes may, in addition to a round embodiment, be of a rectangular, flat or square shape also. The size, shape and number of the openings in the inlet and distribution channels as well as their spacing to each other may be selected according to the respective conditions and, in particular, in regard of providing an inlet flow with generally the same fluid volume and the same fluid pressure per surface unit across the entire diffusor area.

According to an advantageous embodiment of the invention, the cross section surfaces of the inlet tubes and/or distribution channels are decreasing from the inlet location towards the end of the tubes, particularly advantageously as a conical embodiment, thus helping to achieve homogeneous pressure conditions and outlet flow volumes of the treatment fluid across the entire diffusor area.

In addition or independently from the inlet flow systems or the shape of the container bottom mentioned above, the object of the invention is also inventively solved by providing inlet flow slots extending parallel to each other under the container bottom in the inlet flow area of the treatment fluid. These inlet flow slots advantageously extend in the same direction as the edges of the substrates to be treated and serve as compensators for the inlet flow of the treatment fluid. These inlet flow slots are advantageously positioned between an inlet flow system, for example, a diffusor system with comb-like arranged distribution channels described previously, positioned underneath the container bottom. An additional effect is that in the case of a round embodiment of the container bottom, these inlet flow slots compensate and/or bridge the spacing between the inlet openings and the diffusor system positioned in one level. Based on these inlet flow slots, steady, optimized flow conditions within the fluid container can be achieved also in regard to the orientation of the wafer axis. It is especially advantageous, when the spacing of the inlet flow slots corresponds to the spacing of substrates in the container. In this manner, the treatment fluid is flowing controlled and directed between the substrates positioned parallel and with a certain spacing to each other, thus providing a more homogeneous optimized application of treatment fluid to the substrate surfaces.

To improve the fluid separation edges and the outlet flow conditions of the fluid at the outlet openings of the slots in general, it is advantageously suggested to embody these openings in the outlet area like a jet.

Advantageously, the inlet flow slots or other inlet openings, for example additional jets, in the area of a substrate carrier are embodied and arranged such that the treatment fluid in the container area is diverted around and above the substrate carrier. This is also possible with accordingly embodied guiding elements. This embodiment prevents dead flow angles that may occur around the substrate carrier. To avoid repetition concerning this embodiment, DE196 44 253 of the same applicant with the same application date is incorporated by reference into the present patent application.

Additionally or alternatively to the features mentioned above, the object of the invention is inventively solved by providing integrally embodied inlet openings for the treatment fluid in the container bottom. The container bottom is hereby advantageously embodied integrally such that the inlet openings are embodied also in the shape of inlet jets with optimized features. The container bottom is manufactured as a completed assembly with inlet openings or jets already integrated, with no assembly required, i.e., the inlet jets do not have to be assembled and installed into the container bottom, as this was the case, for instance, in the embodiment of DE 196 16 402 of the same applicant, which has not been published as of the filing date of this application. Significant assembly costs and considerable adjustment procedures are eliminated and no steps for the machining of threads and other parts for jets are required. It is especially advantageous that inlet openings as well as supply lines for these openings can be designed so as to have significantly less volume, thus keeping openings and cavities to a minimum and reliably preventing unnecessary fluid volumes and, in particular, development and accumulation of bubbles. Furthermore, the embodiment and arrangement of the inlet openings and jets may be optimized regarding their shape and size according to their respective position in the container bottom, providing an especially homogeneous flow distribution within the container. The embodiment and/or arrangement of the jets in the container bottom can be provided without subsequent adjustments.

According to an especially advantageous embodiment of the invention, the container bottom is comprised of integrated fluid channels for the supply of the inlet openings with treatment fluid. According to this feature, the fluid channels within the container bottom that are supplying the inlet openings with fluid, are integrally embodied. They do not have to be installed or assembled. In this manner, it is in particular possible to optimally adapt the fluid channels, their arrangement and diameter according to the inlet openings, thus preventing dead cavities or separation edges that otherwise would cause areas with inefficient flow and development of bubbles.

The container bottom including the embodied inlet openings, for instance inlet jets or holes, and/or the embodied fluid channels as well, are advantageously manufactured by injection molding. Another advantageous embodiment of the invention comprises manufacturing of the container bottom with integrated inlet openings and channels utilizing laser lithography technology.

According to another advantageous embodiment of the invention, the container bottom comprises a connection channel for introducing treatment fluid into the container bottom. In this manner, the container bottom is provided with an integrated inner thread, advantageously in the connection area, to which the treatment fluid line is attached or threaded. This feature also contributes to a uniform, single-piece container bottom arrangement and is easy to manufacture.

According to another very advantageous embodiment of the invention, the connection channel is divided into several segments, preferably four, at the inlet of the container bottom. According to another advantageous embodiment of the invention, several channel arms branch off, preferably correlated with the individual separate segments. In this manner, a fluid distribution system within the container bottom can be easily achieved and optimized in respect to the applications. In this context it is advantageous, when the cross section of the channel arms is decreasing towards the channel outlet, thus providing, as previously described, homogeneous pressure distribution across the channel arms.

According to a further solution of the object of the invention, an optimal and uniform treatment across the entire substrate surface and at all substrate locations is to be achieved and this is possible when advantageously the bubbles, that are contained in the treatment fluid or develop during introduction of the treatment fluid, are guided into venting channels or grooves provided therefor. Bubbles adversely affect the treatment of the substrates, for example, by causing an irregular application of treatment fluid, for example, a rinsing agent, to the substrates or by adhering temporarily to the surface of the substrates, thus preventing the homogeneous treatment of all substrate areas with treatment fluid. Advantageously, the venting channels or grooves are provided along the side walls of the container and, in particular, along the container walls extending perpendicularly to the substrate surfaces. The bubbles are collected in these channels, so that the actual treatment fluid which contacts the substrates to be processed is largely free of bubbles.

In case of a round or circular arc-shaped cross section embodiment of the container bottom, the venting channels are provided in the upper area of the laterally ascending container bottom.

It is especially advantageous when the shape of the container bottom matches the shape of the substrates to be processed. In this manner, unnecessary volumes within the container are eliminated, thus minimizing the fluid volume and improving the flow conditions within the container, in particular around the substrates, providing a more homogeneous flow distribution and more uniform treatment of the substrates across the entire substrate areas. To this end, it is not only possible to reduce the required volume of costly treatment fluid, but also to reduce the necessary amount of time for the treatment steps with the same results, for example during a rinse cycle, because less treatment fluid has to be introduced into the container or discharged from the container. Furthermore, by adapting the shape of the container bottom to the shape of the substrates, the flow conditions within the container and thus the treatment results, for instance by providing a homogeneous rinse of the substrates, can also be improved.

For disk-shaped substrates, for example, for the treatment of disk-shaped wafers, CDs or CD-ROMs as well as disk-shaped masks or LED display devices, a round or circular embodiment of the container bottom cross section is in particular advantageous. The embodiment of the round container bottom is advantageously provided concentric to the disk-shaped substrates. In this manner, dead areas or container and volume areas that are not required for the treatment of substrates are eliminated. The arrangement of the inlet openings along the round container bottom in comparison to conventional fluid containers with a flat or somewhat slanted container bottom can be optimized, thus providing homogeneous flow conditions within the fluid container.

This device for treatment of substrates can be used for all types of substrates. The term substrates comprises not only wafers, CDs, CD-ROMs, masks or LED display devices, but all objects or parts that may be subjected to a surface treatment, rinsing or drying process.

BRIEF DESCRIPTION OF THE DRAWINGS

Additional features, embodiments and benefits of the present invention are disclosed with the aid of the following preferred embodiments in reference to the figures. It is shown in:

FIGS. 5a and 5b: a schematic top view and cross section of an embodiment of an inlet flow slot bottom, FIGS. 6a and 6b: a schematic top view and cross section of another embodiment of the inlet flow slot bottom, FIGS. 7a and 7b: a schematic top view and cross section of a third embodiment of the inlet flow slot bottom.

DESCRIPTION OF THE PREFERRED EMBODIMENTS

Figure 1:
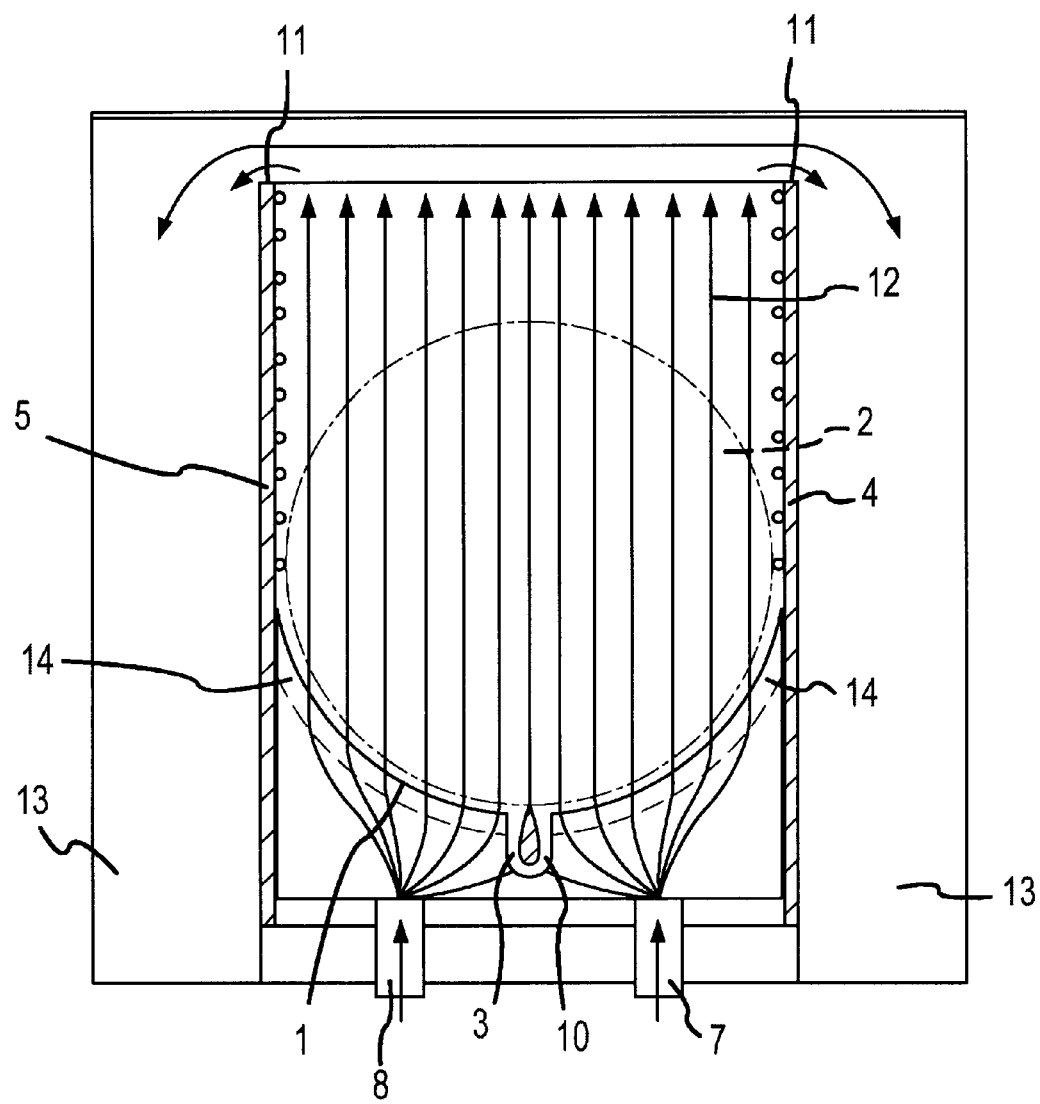
FIG. 1: a schematic cross section of the device according to the invention with an embodiment of the container bottom adapted to the shape of the substrates.

The embodiment in FIG. 1 comprises a container bottom 1 adapted to the shape of the substrates 2, in this case a circular form. The substrates 2 are positioned on their edges on a substrate carrier 3, in this embodiment embodied as a knife-like bridge and movable in a reciprocating manner with the substrates. The substrates are guided by the side walls 4, 5 between vertically arranged cams, that inwardly protrude from the container walls 4, 5.

The treatment fluid is supplied into the container bottom 1 via inlet tubes 7, 8 and distributed to inlet openings of the container bottom outlet area and, if applicable, into a slot 10 for the substrate carrier 3. The treatment fluid, supplied from the container bottom, then flows past the substrates 2, treats or rinses these substrates and flows across the overflow edges 11 at the upper end of the fluid container 12 out into the overflow container 13. Because the embodiment of the bottom of the fluid container 12 is adapted to the shape of the wafers, no dead volume is present inside the container, and the fluid distribution across the substrates 2 is improved substantially as well, thus providing steady, optimized flow conditions in the fluid container 12 and homogeneous application of the treatment fluid to all substrate areas of the substrates 2.

The upper areas of the round or, in cross section, circular container bottom 1 venting channels 14 are provided at or near the container walls 4, 5, allowing the accumulation of bubbles and preventing the bubbles, that form in the treatment fluid inlet flow, but may also develop during introduction into the container 12, from being introduced into the fluid container 12.

Figure 2:
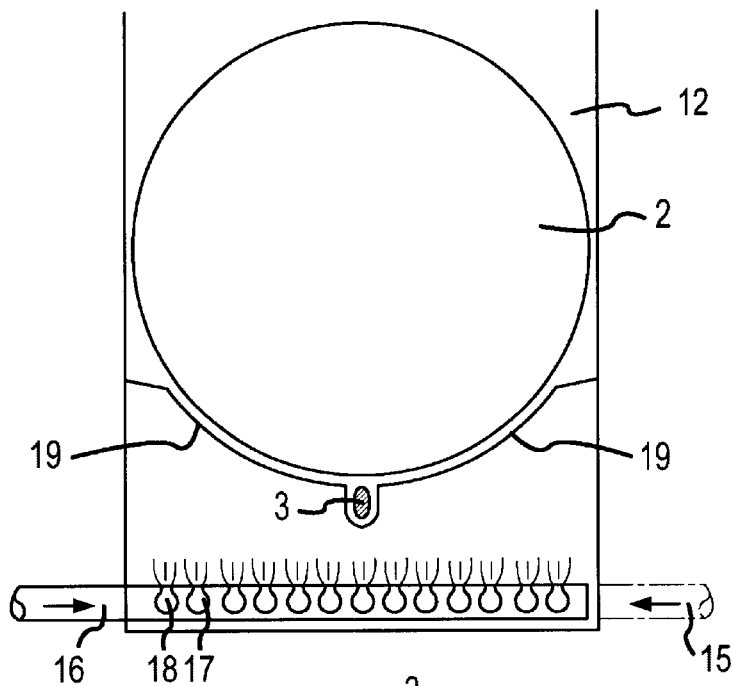
FIG. 2: a schematic cross section through an embodiment of the device according to the invention with a fluid distribution system under the container bottom.
Figure 3:
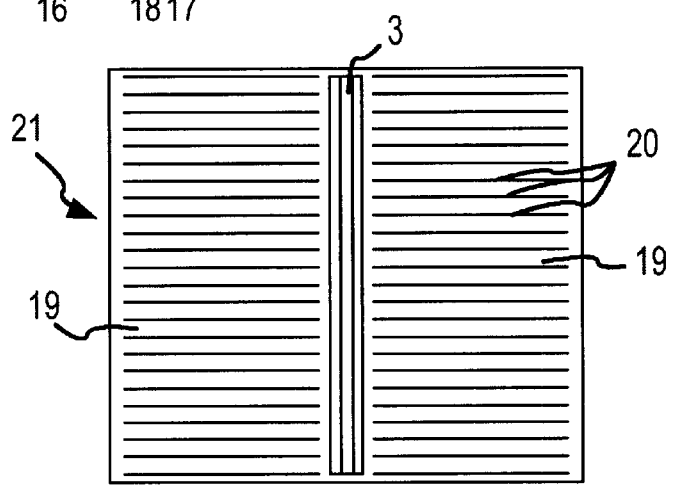
FIG. 3: a top view of the container bottom with inlet flow slot.
Figure 4:
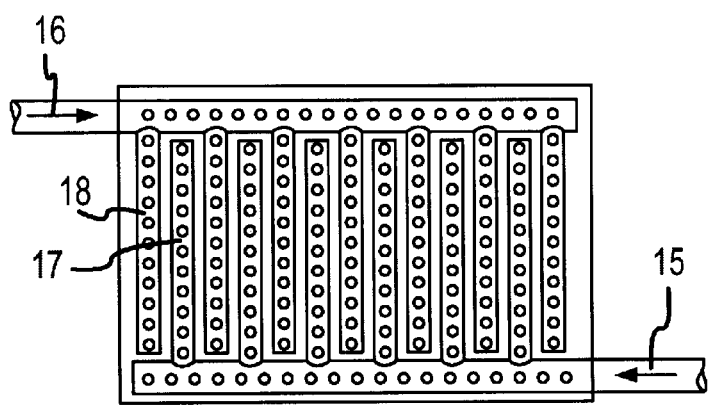
FIG. 4: an embodiment of the distribution channels under the container bottom.

FIGS. 2, 3 and 4 show an embodiment of the device according to the invention, wherein the fluid supply system under the container bottom 1 is comprised of two inlet tubes 15, 16 that extend on two different sides of the fluid container and are supplied separately with treatment fluid. From the inlet tubes, comb-like, perpendicularly extending distribution channels 17, 18 are branching off in the same plane. The distribution channels 17, 18 of the inlet tubes 15, 16 are positioned alternately between each other. In this manner, homogeneous fluid and/or flow or pressure distribution across the entire diffusor arrangement is achieved. The lowest fluid pressure occurs at the end of the distribution channels 17, 18. However, extending parallel to them, the distribution channels from the other inlet tube 16 or 15 are positioned, providing this area with relatively high fluid pressure, because of its proximity to the inlet tubes 15, 16. In this manner, a compensation of the pressure conditions across the area is provided, resulting in a homogeneous flow distribution across the entire diffusor area. FIG. 2 represents a cross section through the schematic top view of the diffusor system, shown in FIG. 4, and shows the arrangement of the diffusor system in relation to the fluid container 12.

The inlet flow slots 20 between the diffusor system, shown in FIG. 4, and the container bottom outlet area 19 form a slot bottom 21 and connect the diffusor system, shown in FIG. 4, with the container bottom outlet area 19. The slots 20 extend in the direction of the edges of the substrates 2 to be processed, wherein the substrate carrier 3, embodied as a knife-like bridge, extends perpendicularly to the inlet flow slots.

The position of the slots 20 in relation to the substrates 2 is selected such that the treatment fluid exits from them and flows between the substrates 2.

FIGS. 5a and 5b show a slot arrangement and/or a flow distribution that does not take into account any dead angles above the substrate carrier 3. In contrast, the embodiment in FIGS. 6a and 6b shows an area 22 around the substrate carrier 3 that differs from the inlet flow slot area by providing jets 23 that are positioned or arranged in a manner that flow of treatment fluid is provided also in the area above the substrate carrier 3. As schematically shown in FIG. 6a, the jets 23 are arranged in a row on each side of the substrate carrier 3.

The embodiment shown in FIGS. 7a and 7b ensures a homogeneous flow distribution above the substrate carrier 3 as well, provided by fluid directing or guiding elements 24 that extend parallel on both sides of the substrate carriers 3 and are embodied in a way that a homogeneous flow distribution across the substrate carrier 3 without any dead angles can be achieved.

Figure 8:
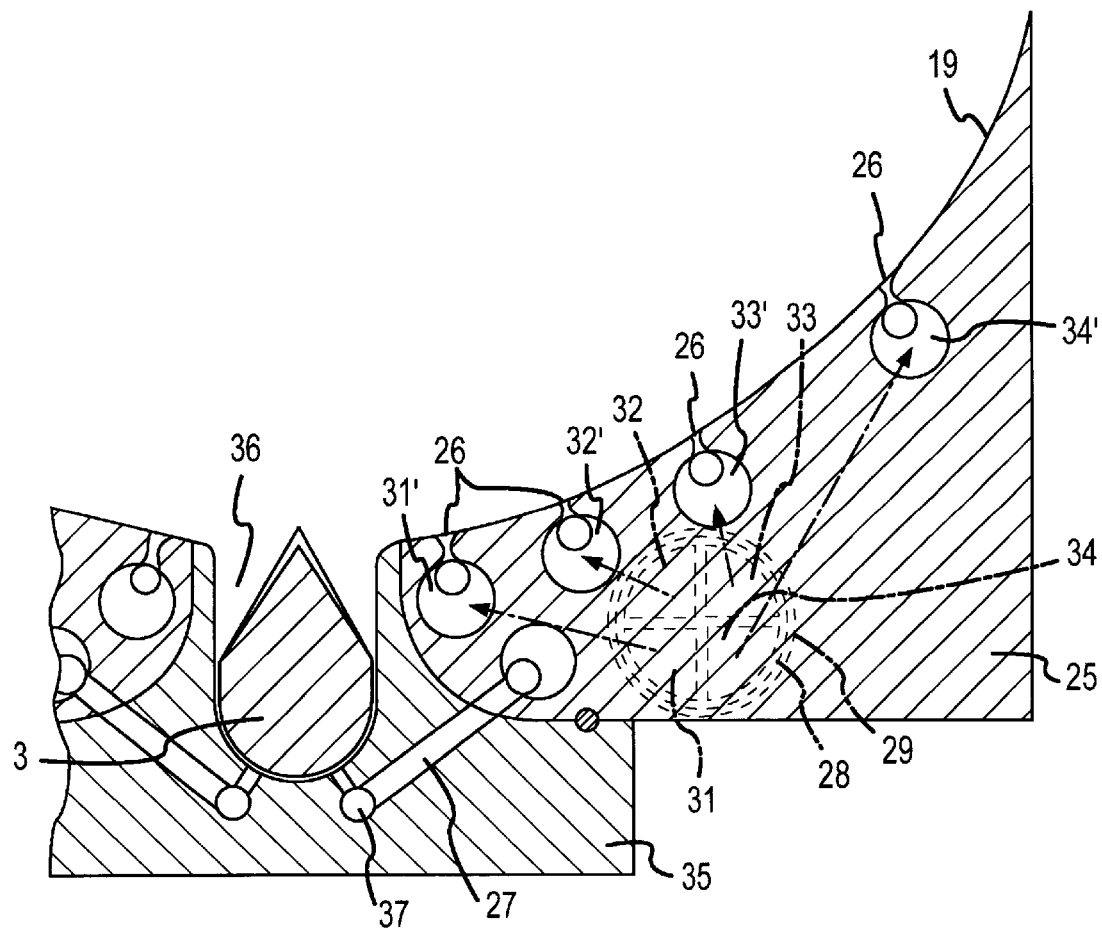
FIG. 8: a schematic partial cross-sectional view of an integrally embodied container bottom with integrated inlet openings and channels.
Figure 9:
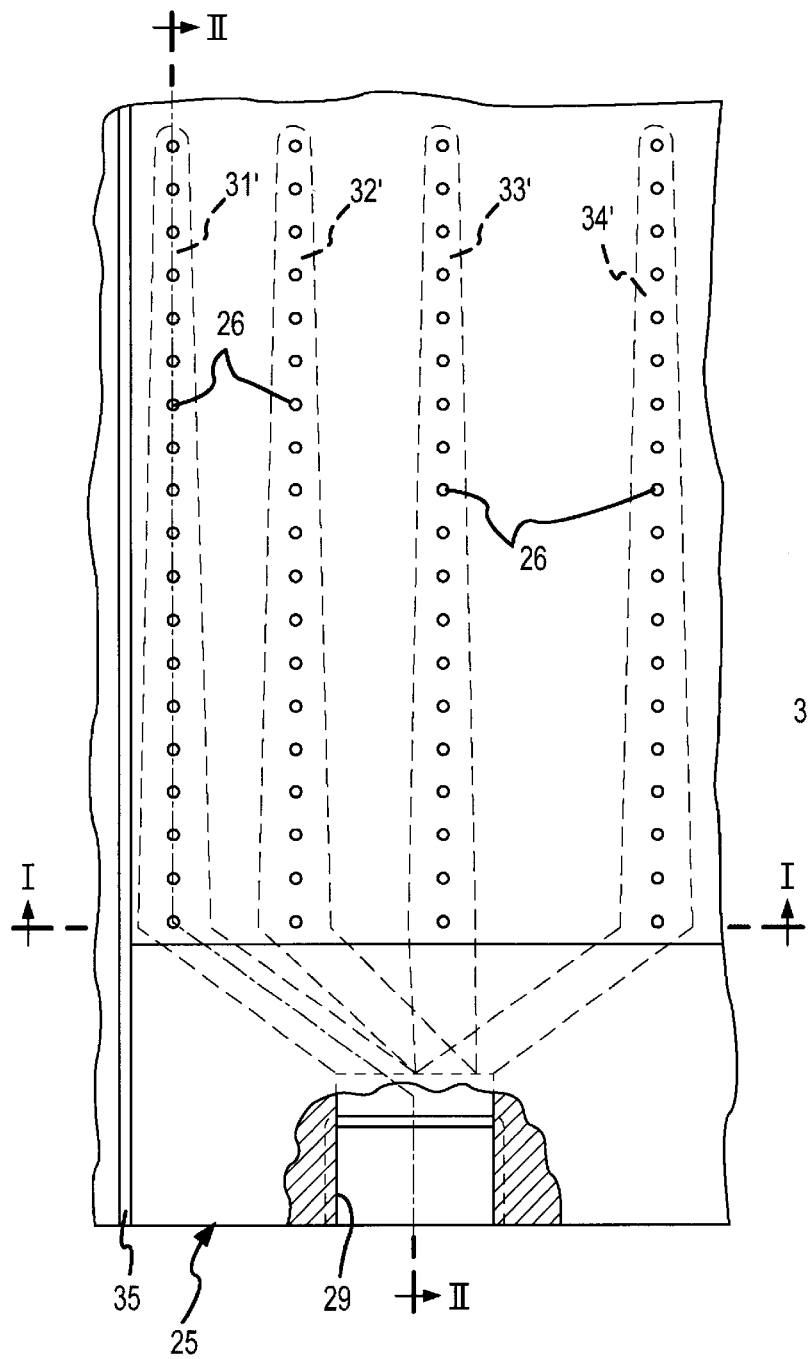
FIG. 9: a schematic partial cross-sectional and top view of the integrated container bottom shown in FIG. 8 and FIG. 10: a cross section of the container bottom in a cross-sectional plane rotated by 900 in respect to FIG. 9.
Figure 10:
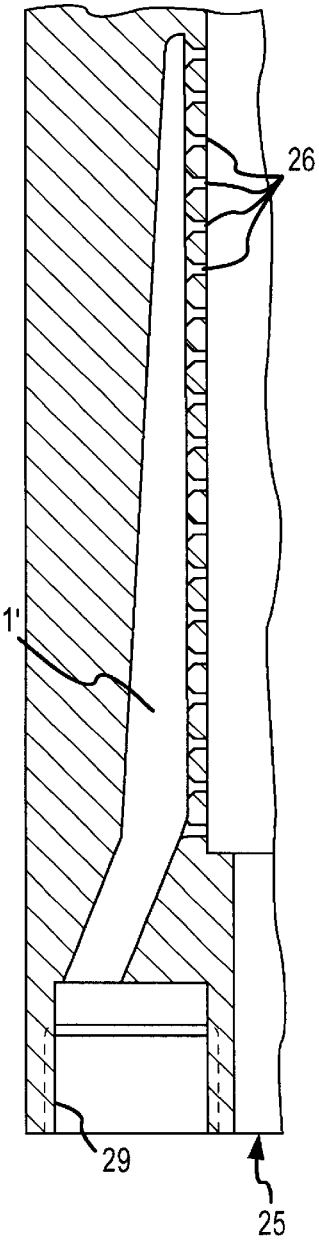

FIGS. 8, 9 and 10 show an embodiment of a container bottom 25, wherein the inlet openings 26 as well as the fluid channels 27 supplying the fluid to the inlet openings 26 are embodied integrally and as a single assembly.

A connection channel 28 with, for example, a ¾ in. inside thread 29, is directly attached to a non-represented fluid supply line. The connection channel 28 for the shown embodiment is divided into four segments 31, 32, 33, 34 that supply the fluid channels 30', 31', 32', 33' integrally embodied in the container bottom 25 with treatment fluid from the inlet openings 26 (see FIG. 9). FIG. 8 shows a schematic cross section along the section line I—I of FIG. 9. The individual jets 26 of a fluid channel are equidistantly arranged on the container bottom outlet area 19, extending perpendicularly to the substrate surfaces, wherein the cross section of the fluid channels 31', 32', 33', 34 is conically decreasing towards the fluid channel ends, as particularly shown in FIG. 10. FIG. 10 shows a schematic cross section along the edge of cut II—II of FIG. 9. FIG. 10 shows in particular that the individual channel arms 31, 32', 33', 34 are tapering towards the channel ends. This is indicated also in FIG. 8 by the respective cross-sectional areas of the fluid channels in the individual fluid channels.

As FIG. 8 shows, the container bottom 25 is a single, pre-manufactured assembly and is attached to a support 35 that comprises a slot 36 for the substrate carrier 3. On the opposite end of the substrate carrier 3, the container bottom 25 is embodied in the same manner; however, this is not represented in FIG. 8.

The embodiment shown in FIG. 8 provides inlet openings 37 for the substrate carrier slot 36, that are used for the introduction of treatment fluid into the substrate carrier slot 36 as well as for rinsing of this slot and the flow generation about the substrate carrier 3. In the embodiment shown, the inlet openings 37 of the substrate carrier slot 36 are supplied by a fluid channel 27 embodied in the container bottom assembly 25. The connection point between the container bottom 25 and the support 35 is not fluid tight. Therefore, a gasket 38 is required between the container bottom assembly 25 and the support 35.

The invention has been disclosed with the aid of preferred embodiments. However, persons skilled in the art may be able to implement various alterations, designs and modifications without departing from the gist of the invention. Of course, the embodiment of the container bottom 25 in the manner shown and described is also possible for a container of a different shape than the container bottom assembly shown in FIG. 8. The specialist may also vary and modify the arrangement and embodiment of the fluid channels and channel arms, as well as their outlet openings or jets according to the conditions and requirements of the application.

The specification incorporates by reference the entire disclosure of International Application PCT/EP97/05407 of Oct. 01, 1997.

The present invention is, of course, in no way restricted to the specific disclosure of the specification and drawings, but also encompasses any modifications within the scope of the appended claims.

What is claimed is:

1. A device for treatment of substrates (2) comprising:
   a container (12) having a bottom (1) and being filled with a treatment fluid, wherein the treatment fluid streams in from below through said bottom (1) of said container;
   at least two inlet tubes (15, 16) for said treatment fluid provided underneath said container bottom (1), wherein each of said at least two inlet tubes (15, 16) is provided with projecting comb-like distribution channels (17, 18), wherein said at least two inlet tubes (15, 16) and said distribution channels (17, 18) are arranged in a common plane;
   wherein said distribution channels (17) of one of said at least two inlet tubes (15) are respectively positioned between two of said distribution channels (18) of another of said at least two inlet tubes (16); and
   wherein cross sections of said distribution channels (17, 18) decrease from inlet locations towards ends of said distribution channels.

2. A device for treatment of substrates according to claim 1, wherein said at least two inlet tubes (15, 26) and said distribution channels (17, 18) have outlet openings.

3. A device for treatment of substrates according to claim 1, wherein cross sections of said at least two inlet tubes (15, 16) decrease from inlet locations towards ends of said at least two inlet tubes.

4. A device for treatment of substrates according to claim 1, wherein said at least two inlet tubes (15, 16) are conically shaped.

5. A device for treatment of substrates according to claim 1, wherein said distribution channels (17,18) are conically shaped.

6. A device for treatment of substrates according to claim 1, wherein said circular arc-shaped container bottom (1) is concentric in respect to said disk-shaped substrates (2).

7. A device for treatment of substrates (2) comprising:
   a container (12) having a bottom (1) and an interior filled with a treatment fluid, wherein the treatment fluid streams in from below through said bottom (1) into said interior of said container;
   said bottom (1) comprising a bottom outlet area (19) and a bottom inlet area;
   parallel-extending vertical inlet flow slots (20) provided in said bottom outlet area (19);
   a diffusor device arranged at said bottom inlet area;
   said inlet flow slots (20) providing a flow connection between said diffusor and the interior of said container (12).

8. A device for treatment of substrates according to claim 7, wherein said inlet flow slots (20) extend in the same direction as edges of said substrates to be treated.

9. A device for treatment of substrates according to claim 7, wherein a spacing between said inlet flow slots (20) corresponds to a spacing between said substrates (2) in said container.

10. A device for treatment of substrates according to claim 7, wherein said inlet flow slots (20) have outlet openings embodied like a jet.

11. A device for treatment of substrates according to claim 7, wherein said bottom of said container (12) has inlet openings (23) arranged in an area of a substrate carrier (3) such that said treatment fluid is diverted into a container area above said substrate carrier (3).

12. A device for treatment of substrates according to claim 7, further comprising guiding elements (24) provided to divert said treatment fluid within or around a container area above said substrate carrier (3).

13. A device for the treatment of substrates (2) comprising:
   a container (12) having a bottom (25) and being filled with a treatment fluid, wherein said treatment fluid streams in from below through said bottom (25), wherein said bottom(25) has at least one connection channel(18) for introduction of said treatment fluid into said bottom (15);
   wherein said bottom (1) of said container has integrally formed inlet openings (26) for said treatment fluid and integrally formed fluid channels (30', 31', 32', 33', 34') for supplying said inlet openings (26) with said treatment fluid; and
   wherein said at least one connection channel (28) has several channel arms (31', 32', 33', 34') branching off said at least one connecting channel.

14. A device for treatment of substrates according to claim 13, wherein said bottom (25) is an injection-molding part.

15. A device for treatment of substrates according to claim 13, wherein said bottom (25) is produced by laser lithography.

16. A device for treatment of substrates according to claim 13, wherein said at least one connection channel (28) is divided into several segments (31, 32, 33, 34).

17. A device for treatment of substrates according to claim 13, wherein cross section areas of said channel arms (31', 32', 33', 34') decrease towards channel ends.

18. A device for treatment of substrates (2) comprising:
a container having a bottom (1) and being filled with a treatment fluid, wherein said treatment fluid streams in from below through said bottom (1) of said container;
wherein said container (12) has side walls (4, 5) having venting channels (14) for venting bubbles contained within said treatment fluid or developed during introduction of said treatment fluid from said container.

19. A device for treatment of substrates according to claim 18, wherein said bottom (1) has a circular cross section and wherein said venting channels (14) are provided in an uppermost area along said sidewalls (4, 5) of said container.

20. A device for treatment of substrates according to claim 18, wherein a shape of said container bottom (1) matches a shape of said substrates (2) to be treated.

21. A device for treatment of substrates according to claim 20, wherein for disk-shaped substrates (2) said bottom (1) has a circular arc-shaped cross section.

* * * * *